United States Patent
Jeoung et al.

(10) Patent No.: US 7,522,139 B2
(45) Date of Patent: Apr. 21, 2009

(54) METHOD OF REDUCING OFF-CURRENT OF A THIN FILM TRANSISTOR FOR DISPLAY DEVICE AND CIRCUIT FOR THE SAME

(75) Inventors: Hun Jeoung, Gyeongsangbuk-do (KR); Sung-Hak Lee, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 708 days.

(21) Appl. No.: 10/865,798

(22) Filed: Jun. 14, 2004

(65) Prior Publication Data

US 2004/0257147 A1 Dec. 23, 2004

(30) Foreign Application Priority Data

Jun. 23, 2003 (KR) ................. 10-2003-0040752

(51) Int. Cl.
*G09G 3/36* (2006.01)
(52) U.S. Cl. .................... 345/92; 345/94; 345/211
(58) Field of Classification Search ............. 345/76–83, 345/87–100, 211–213
See application file for complete search history.

(56) References Cited

U.S. PATENT DOCUMENTS

| | | | | |
|---|---|---|---|---|
| 4,316,101 A | * | 2/1982 | Minner | 327/434 |
| 5,945,866 A | * | 8/1999 | Fonash et al. | 327/427 |
| 6,169,532 B1 | * | 1/2001 | Sumi et al. | 345/98 |
| 6,690,149 B2 | * | 2/2004 | Monomoushi et al. | 323/297 |
| 7,071,932 B2 | * | 7/2006 | Libsch et al. | 345/211 |
| 2004/0041618 A1 | * | 3/2004 | Ha et al. | 327/427 |
| 2004/0257147 A1 | * | 12/2004 | Jeoung et al. | 327/427 |
| 2005/0057580 A1 | * | 3/2005 | Yamano et al. | 345/690 |

FOREIGN PATENT DOCUMENTS

KR 2002-0051513 3/2004

OTHER PUBLICATIONS

Communication from Korean Patent Office.

* cited by examiner

*Primary Examiner*—Kent Chang
(74) *Attorney, Agent, or Firm*—McKenna Long & Aldridge LLP

(57) ABSTRACT

A method of applying an OFF-state offset to a display device includes: supplying a ground voltage from a data driving circuit; to a source electrode of a thin film transistor supplying a gate voltage from a gate driving circuit to a gate electrode of the thin film transistor, the gate voltage turning off the thin film transistor; and supplying an AC voltage to a drain electrode of the thin film transistor.

7 Claims, 6 Drawing Sheets

METHOD OF REDUCING OFF-CURRENT OF A THIN FILM TRANSISTOR FOR DISPLAY DEVICE AND CIRCUIT FOR THE SAME

This application claims the benefit of Korean Patent Application No. 2003-40752, filed on Jun. 23, 2003, which is hereby incorporated by reference for all purposes as if set forth herein.

BACKGROUND OF THE INVENTION

1. Field of the Invention

The present invention relates to a display device having a thin film transistor, and more particularly, to a method of applying an OFF-state offset to a P-type polycrystalline thin film transistor for a liquid crystal display device.

2. Discussion of the Related Art

Display systems that display information have been the subject of research. Cathode-ray tubes (CRTs), for example have generally been used for such display systems. However, use of flat panel displays (FPDs) is becoming increasingly common because of their small depth, low weight and low power consumption. Thin-film transistor-liquid crystal displays (TFT-LCDs) are being developed that have high resolution, small depth and high color reproducibility.

When a pixel is turned on by a switching element, the pixel transmits light from a backlight unit. Amorphous silicon (a-Si:H) thin film transistors (TFTs) that include a semiconductor layer of amorphous silicon are widely used as switching elements because the amorphous silicon thin film transistor can be formed on a large-sized insulating substrate such as a glass substrate under a low temperature. Even though TFT-LCDs using amorphous silicon TFTs have an advantage over CRTs of low power consumption, the price of TFT-LCDs is higher than that of CRTs because TFT-LCDs require an expensive driving circuit.

FIG. 1 is a schematic plan view of an amorphous silicon thin film transistor liquid crystal display device according to the related art. In FIG. 1, a substrate 10 includes a display region "D." A gate driving integrated circuit (IC) 20 and a data driving IC 30 are formed between the display region "D" and a printed circuit board (PCB) 40. Generally, the gate and data driving ICs 20 and 30, which are referred to as a large scale integration (LSI), are fabricated using single crystalline silicon and connected to the substrate using a tape automated bonding (TAB) method. However, as the resolution of the liquid crystal display (LCD) device increases, more leads are necessary to connect the substrate and the driving LSI. For example, in a super extended graphic array (SXGA) display having 1280×1024×3 pixels, at least 1280×3+1024 leads are required for connection. The process for fabricating large numbers of leads is complex, thereby reducing reliability and production yield. Moreover, the price of LCD devices increases due to the expensive driving LSI. To solve these problems, LCD devices using a polycrystalline silicon thin film transistor are suggested.

FIG. 2 is a schematic plan view of a polycrystalline silicon thin film transistor liquid crystal display device according to the related art. In FIG. 2, a substrate 10 includes a display region "D." Contrary to LCD devices using an amorphous silicon thin film transistor, a gate driving circuit 22 and a data driving circuit 32 of the LCD device of FIG. 2 are formed directly on the substrate 10 using polycrystalline silicon as a switching element of each pixel (not shown). Accordingly, an additional process of connecting the substrate and a driving LSI is not necessary.

The polycrystalline silicon thin film transistor liquid crystal display device includes first and second substrates facing and spaced apart from each other, and a liquid crystal layer interposed therebetween. The first substrate having a thin film transistor (TFT) "T" and array lines, and the second substrate having a black matrix and a color filter layer are fabricated through various process steps. Among the various process steps, a process for stabilizing the TFT "T" may be performed for the first substrate having the TFT "T" or for the attached first and second substrates, i.e. for a cell having the TFT "T." When a polycrystalline silicon (p-Si) TFT-LCD device is driven for a long period of time under room temperature, carriers generated at a P-N (positive-negative) junction of the p-Si TFT may produce an OFF-current ($I_{OFF}$) and the OFF-current ($I_{OFF}$) may leave residual images on the liquid crystal panel which can degrade the LCD device. Accordingly, a stabilizing process is performed in which an OFF-state offset is applied to the P-type TFT to prevent the residual images. To apply an OFF-state offset means to apply a voltage opposite to or different from a normal voltage. Through this stabilizing process, the OFF-current may be reduced and mobility of the TFT may be improved.

One method of applying an OFF-state offset is disclosed in Korean Patent Application No. 10-2002-51513. Korean Patent Application No. 10-2002-51513 discloses a method of applying a pulse of alternating current (AC) to one of a gate terminal, a source terminal and a drain terminal of a pixel TFT and a liquid crystal panel using the same. The OFF-state offset is applied to the TFT regardless of a liquid crystal capacitor and a storage capacitor. In addition, the OFF-state offset is applied to a plurality of TFTs in the liquid crystal panel at one time and characteristics of the plurality of TFTs including an OFF current are improved.

FIGS. 3A and 3B are an equivalent circuit diagram and a timing chart, respectively, illustrating a method of applying signals to a P-type thin film transistor according to the related art. In FIGS. 3A and 3B, a ground voltage is applied to a source electrode of a P-type TFT "SW" through a data line ($V_D=0V$), and a positive voltage is applied to a gate electrode of the P-type TFT "SW" through a gate line ($V_G>0V$). A pulse is applied to a storage electrode through a storage line ($V_{ST}$=PULSE). Accordingly, an OFF-state offset is applied to both the source and drain electrodes of the P-type TFT "SW."

In order to apply the ground voltage, the positive voltage and the pulse, pads are formed on a substrate having the TFT. FIG. 4 is a schematic view showing pads for applying signals according to the related art. In FIG. 4, a display region 60 is defined at a central portion of a substrate 10. Even though not shown in FIG. 4, a plurality of P-type TFTs are formed in the display region 60. Pads 50 are formed at an edge portion of the substrate 10. Signals for OFF-state offset are applied to the plurality of P-type TFTs through the pads 50 from an external circuit.

However, because an additional process of forming the pads 50 is required, the total steps for forming an LCD device increase. In addition, static electricity of the pads may cause a deterioration in the LCD device.

SUMMARY OF THE INVENTION

Accordingly, the present invention is directed to a method of reducing an off-current of a thin film transistor for a display device that substantially obviates one or more of the problems due to limitations and disadvantages of the related art.

An advantage of the present invention is to provide a method of applying an off-state offset to a P-type thin film transistor, without having an additional circuit, to improve off-current and mobility.

Another advantage of the present invention is to provide a method of reducing an OFF-current of a thin film transistor for a liquid crystal display device using a tape automated bonding method or a printed circuit board.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a method of applying an off-state offset to a display device includes: supplying a ground voltage from a data driving circuit to a source electrode of a thin film transistor; supplying a gate voltage to a gate electrode of the thin film transistor from a gate driving circuit, the gate voltage turning off the thin film transistor; and supplying an alternating current (AC) voltage to a drain electrode of the thin film transistor.

In another aspect, a method of applying an OFF-state offset to a display device includes: supplying an AC (alternating current) voltage to a source electrode of a thin film transistor from a data driving circuit; and supplying a gate voltage to a gate electrode of the thin film transistor from a gate driving circuit, the gate voltage turning off the thin film transistor.

In another aspect of the present invention, a display device for applying an OFF-state offset includes: a gate line on a substrate; a data line crossing the gate line; a thin film transistor having a gate electrode connected to the gate line, a source electrode connected to the data line and a drain electrode; a gate driving circuit connected to the gate line; a data driving circuit connected to the data line; and an external circuit connected to the gate driving circuit and the data driving circuit, the external circuit having a switch for selecting one of a vertical start pulse and a direct current (DC) voltage gate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, similar reference numbers will be used to refer to the same or similar parts.

Figure 1:
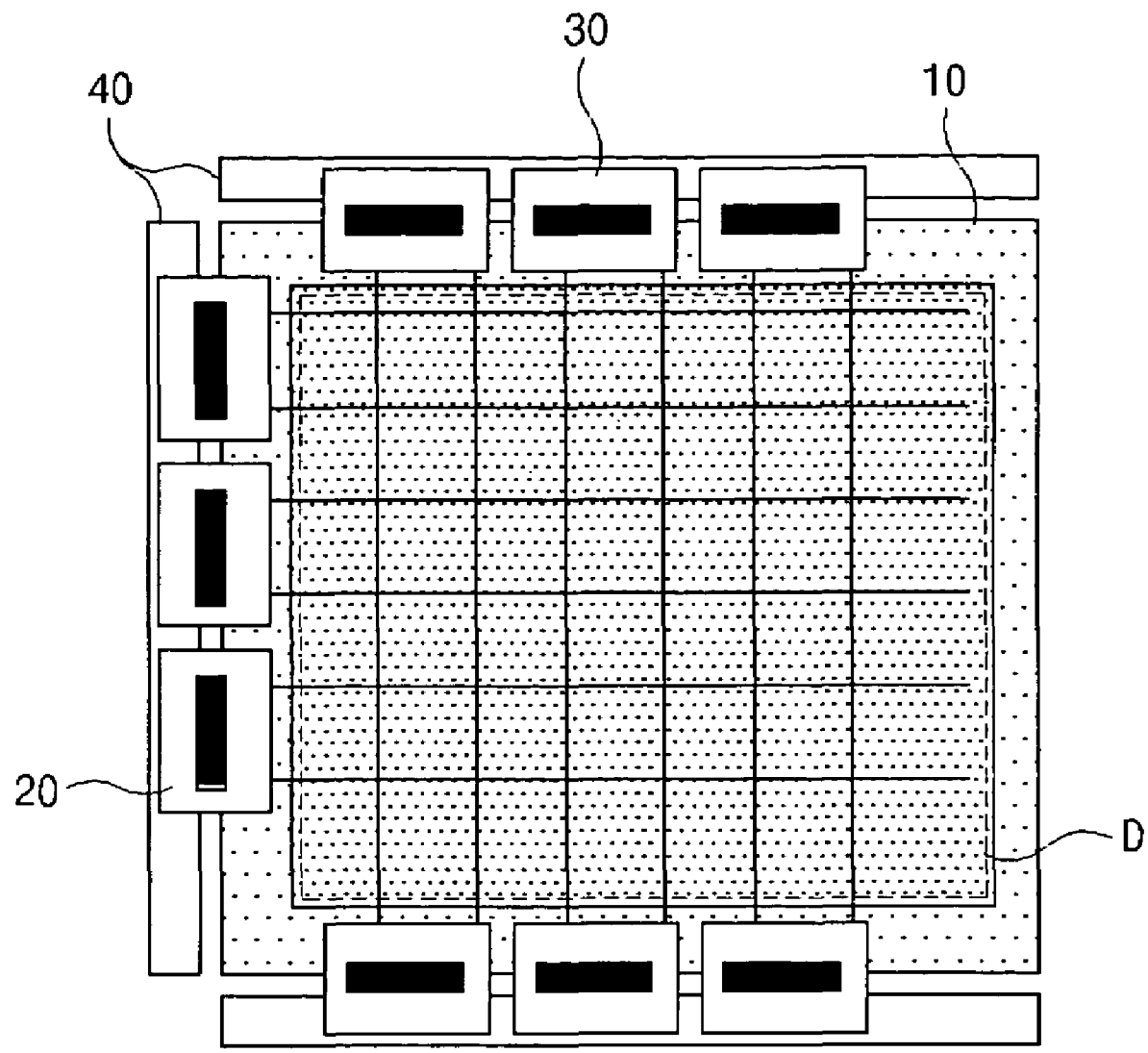
FIG. 1 is a schematic plan view of an amorphous silicon thin film transistor liquid crystal display device according to the related art.
Figure 2:
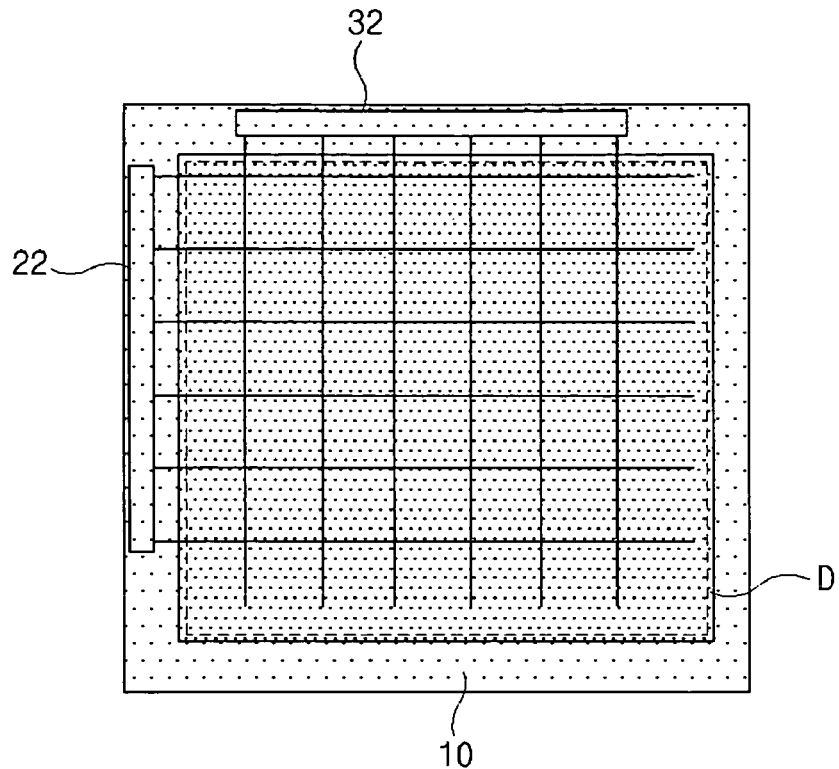
FIG. 2 is a schematic plan view of a polycrystalline silicon thin film transistor liquid crystal display device according to the related art.
Figure 3A:
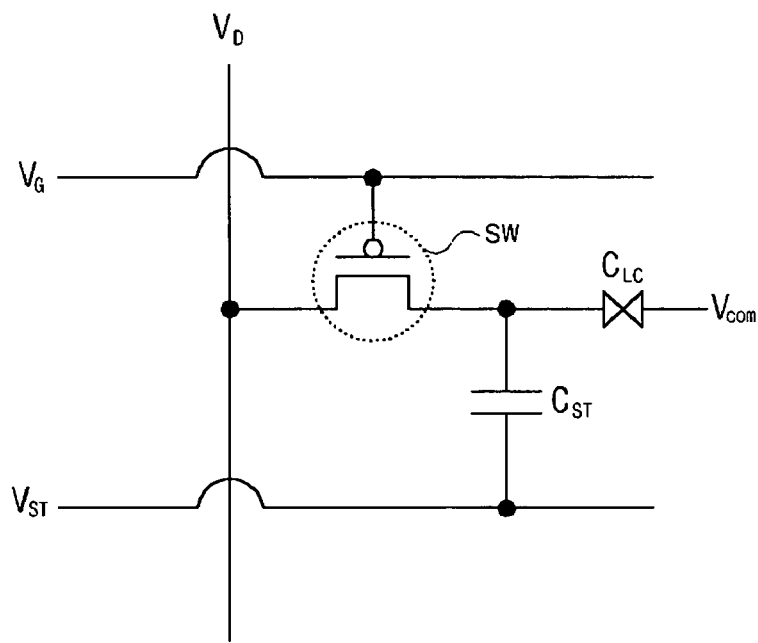
FIG. 3A is an equivalent circuit diagram illustrating a method of applying signals to a P-type thin film transistor according to the related art.
Figure 3B:
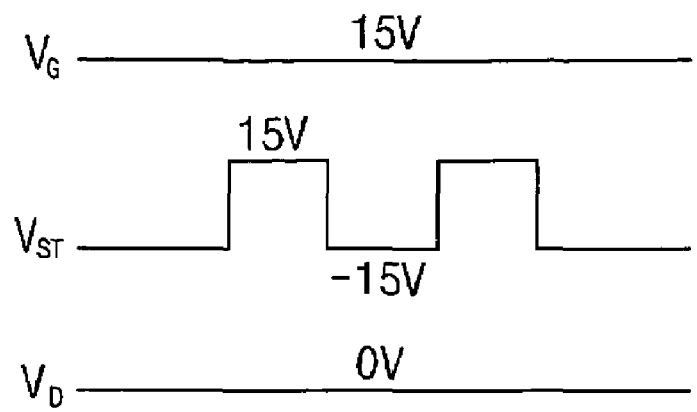
FIG. 3B is a timing chart illustrating a method of applying signals to a P-type thin film transistor according to the related art.
Figure 4:
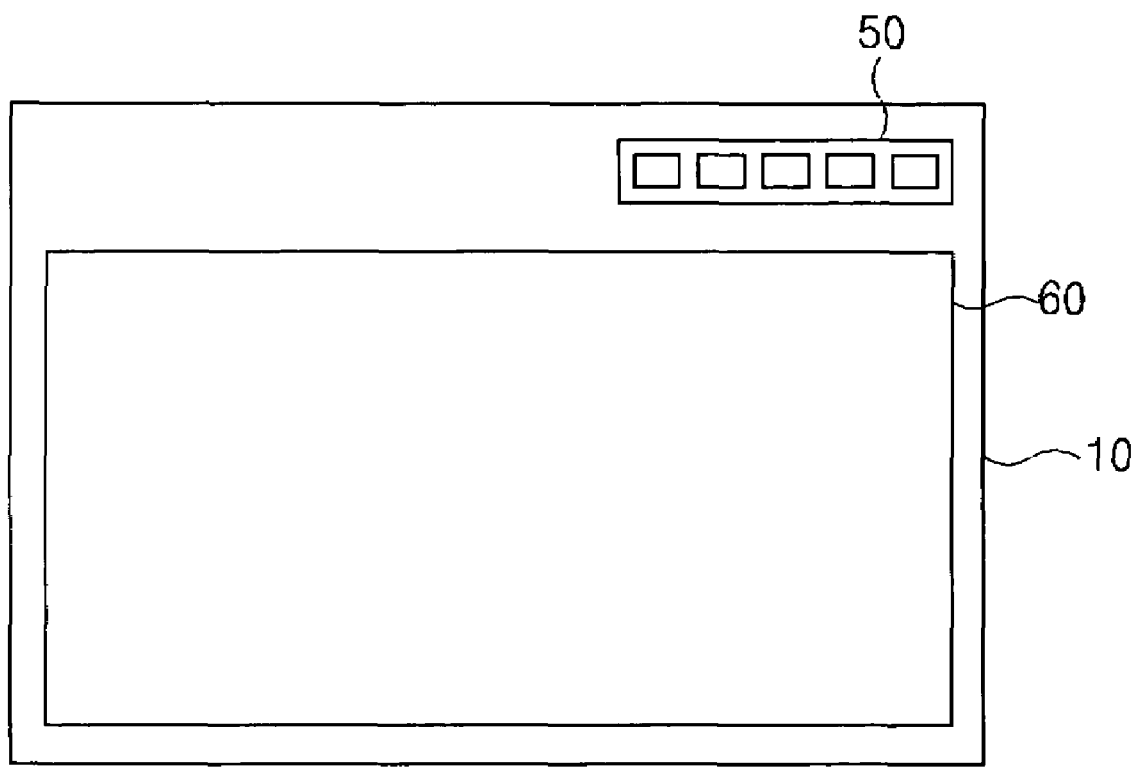
FIG. 4 is a schematic view illustrating pads for applying signals according to the related art.
Figure 5:
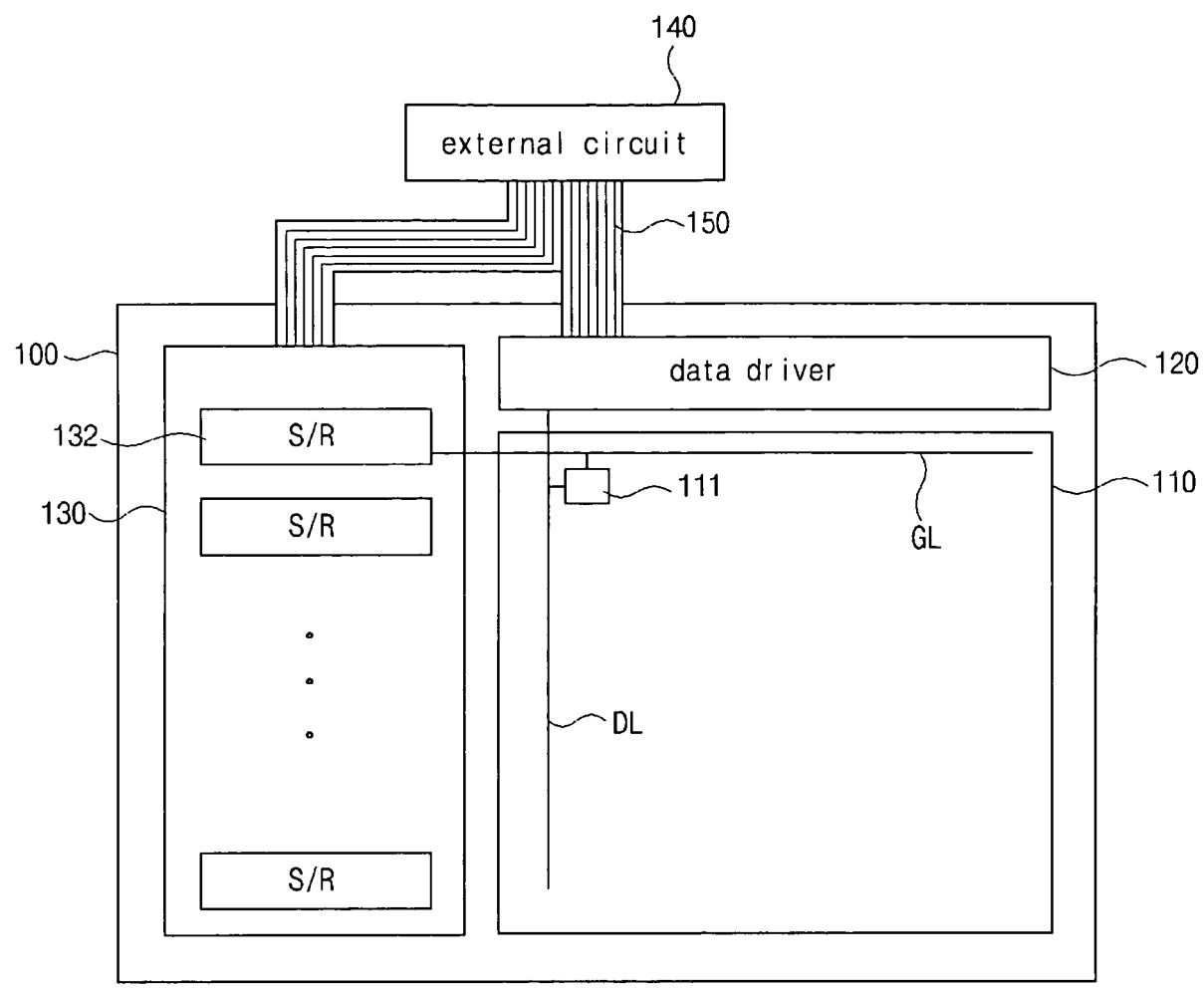
FIG. 5 is a schematic view illustrating a display device according to an embodiment of the present invention.

FIG. 5 is a schematic view illustrating a display device according to an embodiment of the present invention.

In FIG. 5, a gate line "GL" and a data line "DL" are formed on a substrate 100. The gate line "GL" crosses the data line "DL" to define a pixel region 111. The gate line "GL," the data line "DL" and the pixel region 111 are disposed in a display region 110 of the substrate 100. A gate driver 130 and a data driver 120 are formed at a periphery of the display region 110. The data driver 120 applies an image signal to the data line "DL" and the gate driver 130 includes a plurality of shift registers 132 that apply a gate driving signal to the gate line "GL." An external circuit 140 is connected to the data driver 120 and the gate driver 130 to supply the image signal, the gate driving signal and timing signals. The external circuit 140 may be formed as a printed circuit board (PCB).

Although not shown in FIG. 5, a thin film transistor (TFT) including a gate electrode, a source electrode and a drain electrode and a storage capacitor may be formed in the pixel region 111. The data line "DL" may be connected to the source electrode and the gate line "GL" may be connected to the gate electrode. The drain electrode may be connected to the storage capacitor. The substrate 100 may be used for a liquid crystal display (LCD) device and an organic electroluminescent display (OELD) device. When the substrate 100 is used for an LCD device, the drain electrode may be connected to a liquid crystal capacitor. When the substrate 100 is used for an OELD device, the drain electrode may be connected to another TFT that is connected to an organic electroluminescent diode. For example, the TFT may be a P-type.

The external circuit 140 may be connected to the substrate 100 using a tape carrier package (TCP) or a flexible printed circuit board (FPC: flexible PCB) 150. For example, an integrated circuit (IC) for the external circuit 140 may be formed on a printed circuit board (PCB) and the PCB may be connected to the substrate 100 through a FPC. Otherwise, an IC for the external circuit 140 may be connected to the substrate 100 using an automated bonding (TAB) method. The external circuit 140 may supply various voltage signals to the TFT in the pixel region 111 to improve its characteristics. For example, a stabilization process of a P-type pixel TFT may be performed by applying an OFF-state offset.

Figure 6:
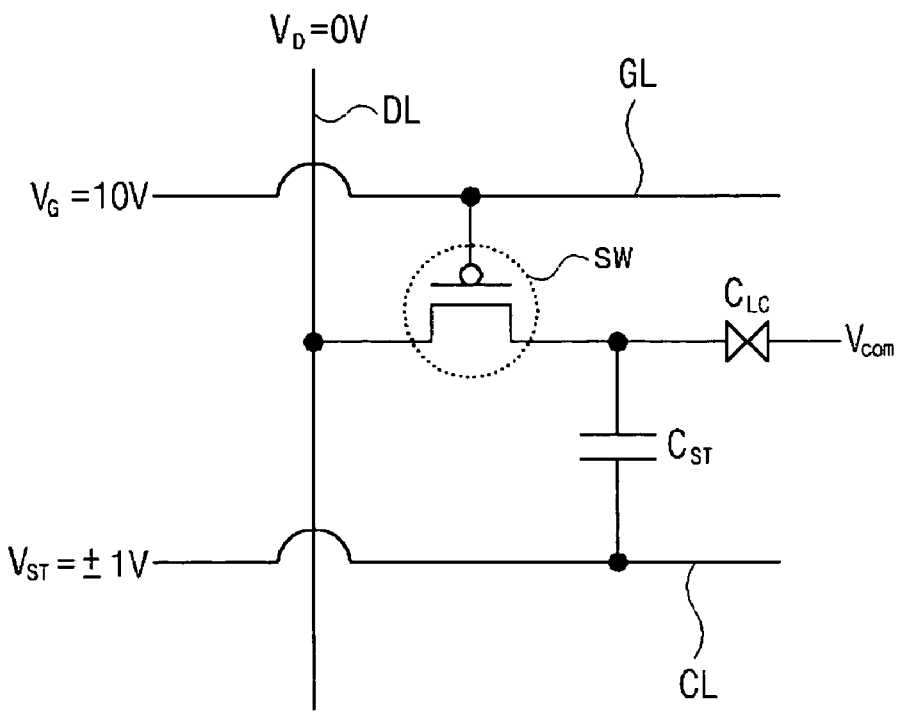
FIG. 6 is an equivalent circuit diagram illustrating compensation signals and elements in a pixel region according to a first embodiment of the present invention.

FIG. 6 is an equivalent circuit diagram showing signals and elements in a pixel region according to a first embodiment of the present invention.

In FIG. 6, an external circuit 140 (of FIG. 5) supplies a ground voltage to a data line "DL" ($V_D$=0V) and a positive voltage to a gate line "GL." For example, a positive voltage of about 10V may be applied to a P-type thin film transistor (TFT) "SW" through the gate line "GL" to turn OFF the TFT "SW" ($V_G$=10V). The external circuit supplies an AC (alternating current) voltage to a storage capacitor "$C_{ST}$" through a common line "CL." For example, a pulse having a maximum value of about +1V and a minimum value of about −1V may be used as the AC voltage ($V_{ST}$=±1V). The common line "CL" may be connected to a common electrode of a liquid crystal capacitor "$C_{LC}$" and the AC voltage may be applied through the common electrode. Accordingly, an OFF-state offset is applied to the P-type TFT "SW."

The positive voltage may be supplied from a shift register 132 (of FIG. 5) connected to the gate line "GL." An output signal of the shift register may be adjusted by compensation signals of the external circuit.

Figure 7:
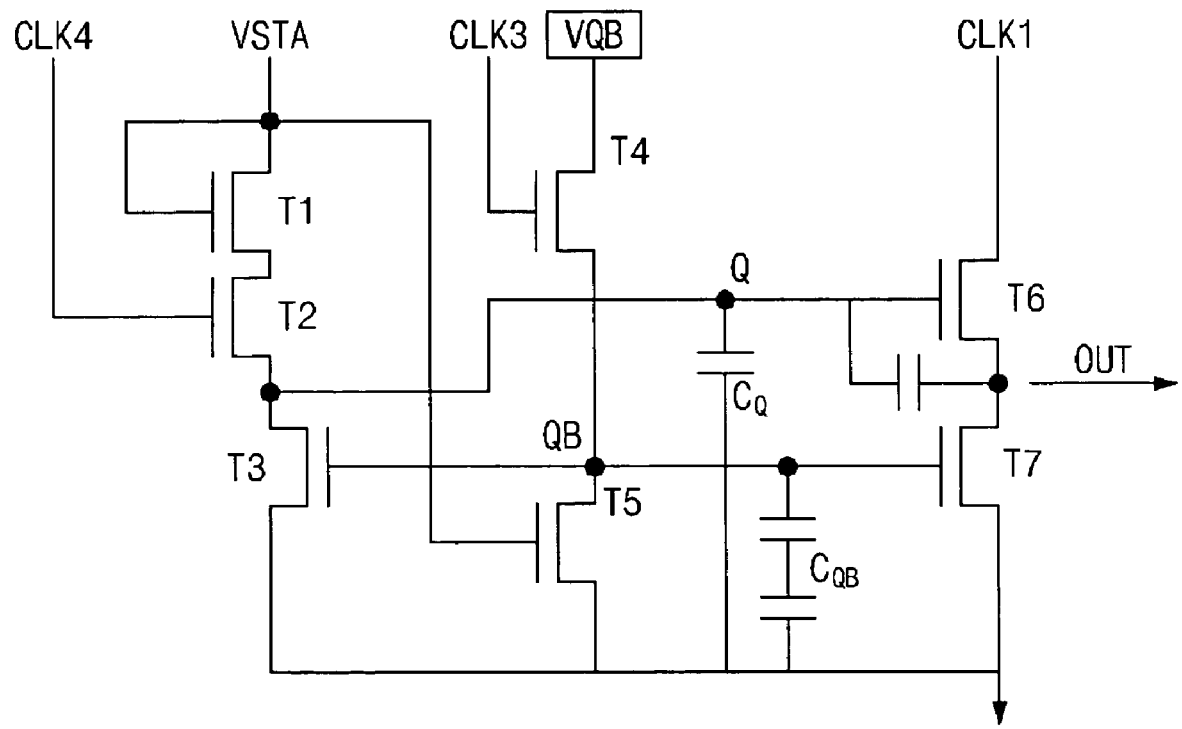
FIG. 7 is an equivalent circuit diagram of a shift register according to a first embodiment of the present invention.
Figure 8:
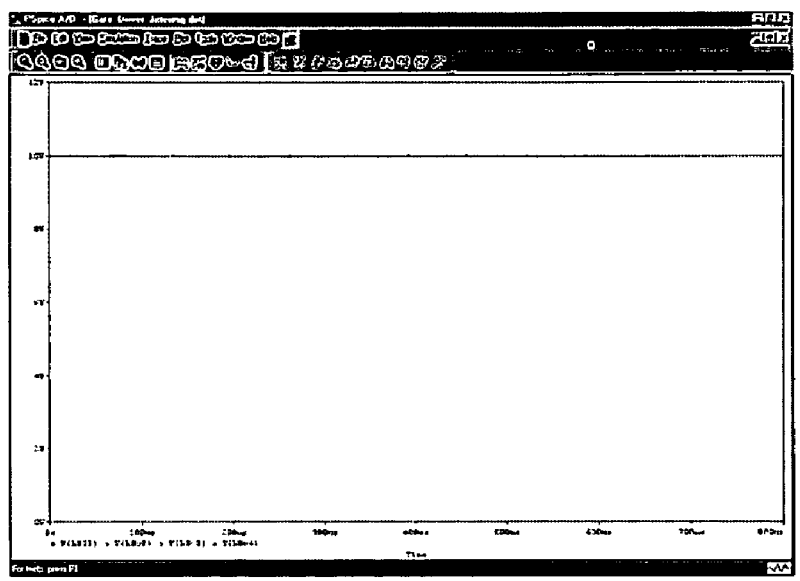
FIG. 8 is a graph showing an output signal of a shift register according to a first embodiment of the present invention.

FIG. 7 is an equivalent circuit diagram of a shift register according to a first embodiment of the present invention and FIG. 8 is a graph showing an output signal of a shift register according to a first embodiment of the present invention. The graph of FIG. 8 is obtained by a P-SPICE simulation.

In FIG. 7, a plurality of clocks and a vertical start signal "VSTA" may be input to a shift register. Under normal display conditions, a clock having a maximum value of about +10V and a minimum value of about −8V may be input to the shift register as the vertical start signal "VSTA" and a gate driving pulse may be output from the shift register. For an OFF-state offset, a positive voltage is required to be applied to a gate line "GL" (of FIG. 6) and the shift register may output the positive voltage by inputting a DC (direct current) voltage instead of the clock. For example, the DC voltage having one of about +10V and −8V may be input to the shift register from the external circuit having an additional switch (not shown). As shown in FIG. 8, a positive voltage of about 10V is output from the shift register when the DC voltage is input to the shift register.

Figure 9:
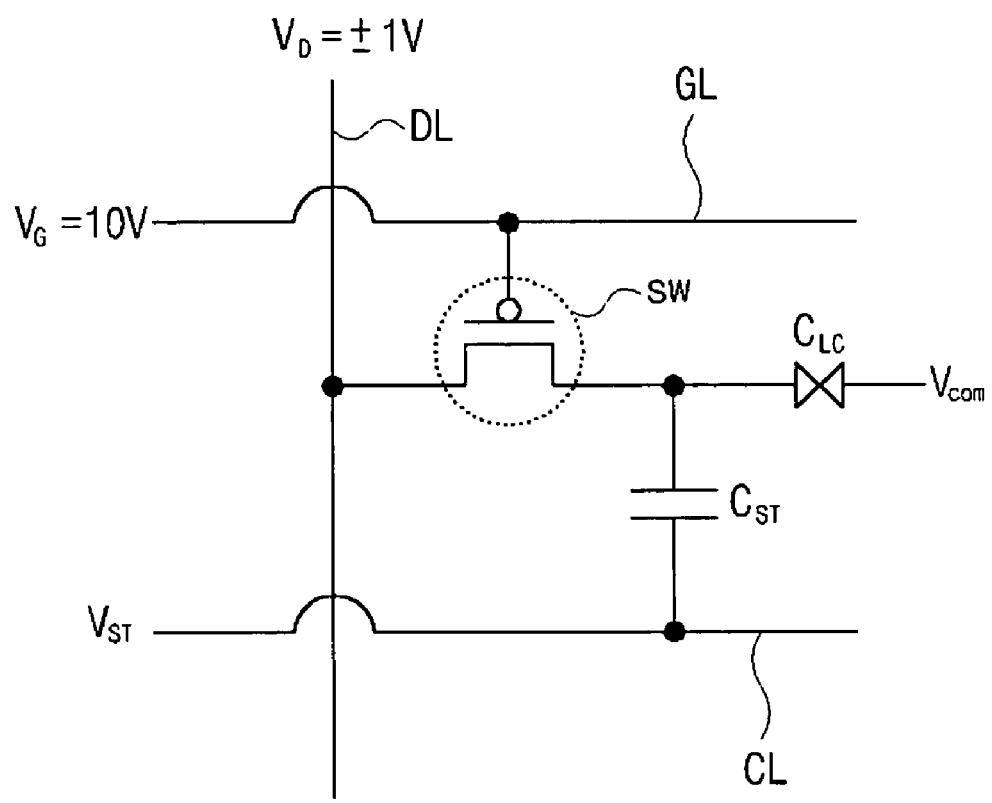
FIG. 9 is an equivalent circuit diagram showing compensation signals and elements in a pixel region according to a second embodiment of the present invention.

FIG. 9 is an equivalent circuit diagram showing signals and elements in a pixel region according to a second embodiment of the present invention.

In FIG. 9, an external circuit 140 (of FIG. 5) supplies an AC (alternating current) voltage to a data line "DL" and a positive voltage to a gate line "GL." For example, a pulse having a maximum value of about +1V and a minimum value of about −1V may be used as the AC voltage ($V_D$=±1V). In addition, the positive voltage of about 10V may be applied to a P-type thin film transistor (TFT) "SW" through the gate line "GL" to turn OFF the TFT "SW" ($V_G$=10V). The external circuit may supply a DC (direct current) voltage to a storage capacitor "$C_{ST}$" through a common line "CL." The common line "CL" may be connected to a common electrode of a liquid crystal capacitor "$C_{LC}$" and the DC voltage may be applied through the common electrode. Accordingly, an OFF-state offset is applied to the P-type TFT "SW."

In the present invention, because an OFF-state offset is applied to a P-type TFT using an external circuit connected to a display panel, an additional process for stabilization of the P-type TFT is not required. In other words, the OFF-state offset is applied after forming the external circuit in a TAB method using TCP or FPC, or after connecting the external circuit on a PCB with the display panel. Accordingly, a stabilization process for a P-type TFT may be performed without increasing the total processing steps. In addition, because an additional pad is not formed on a display panel, a static electricity, due to the pad, is prevented. Moreover, the stabilization process for a P-type TFT may be applied to a liquid crystal display (LCD) device or an organic electroluminescent display (OELD) device.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method of applying an OFF-state offset to a display device, comprising:
   supplying a ground voltage from a data driving circuit to a source electrode of a thin film transistor; supplying a gate voltage from a gate driving circuit to a gate electrode of the thin film transistor, the gate voltage turning off the thin film transistor; and
   supplying an AC voltage to a drain electrode of the thin film transistor turned off by the gate voltage.

2. The method according to claim 1, further comprising supplying a DC voltage to the gate driving circuit from an external circuit connected to the gate driving circuit and the data driving circuit.

3. The method according to claim 2, wherein the gate driving circuit includes a shift register and the DC voltage is input to the shift register.

4. The method according to claim 2, wherein the DC voltage is one of about 10V and about −8V.

5. The method according to claim 1, wherein the source electrode is connected to the data driving circuit through a data line and the gate electrode is connected to the gate driving circuit through a gate line.

6. The method according to claim 1, wherein the AC voltage is supplied to the drain electrode through a storage capacitor connected to the drain electrode.

7. The method according to claim 1, wherein the AC voltage has a maximum value of +1V and a minimum value of −1V.

* * * * *